(12) United States Patent
Shen et al.

(10) Patent No.: US 11,031,418 B2
(45) Date of Patent: Jun. 8, 2021

(54) INTEGRATED CIRCUIT STRUCTURE AND METHOD WITH HYBRID ORIENTATION FOR FINFET

(71) Applicant: Taiwan Semiconductor Manufacturing Co., Ltd., Hsin-Chu (TW)

(72) Inventors: Tzer-Min Shen, Hsinchu (TW); Zhiqiang Wu, Hsinchu County (TW); Chung-Cheng Wu, Hsin-Chu County (TW); Ching-Wei Tsai, Hsinchu (TW); Kuan-Lun Cheng, Hsin-Chu (TW); Chih-Hao Wang, Hsinchu County (TW); Min Cao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/741,530

(22) Filed: Jan. 13, 2020

(65) Prior Publication Data
US 2020/0152666 A1     May 14, 2020

Related U.S. Application Data

(62) Division of application No. 15/800,390, filed on Nov. 1, 2017, now Pat. No. 10,535,680.
(Continued)

(51) Int. Cl.
*H01L 21/8238* (2006.01)
*H01L 27/12* (2006.01)
(Continued)

(52) U.S. Cl.
CPC .... *H01L 27/1207* (2013.01); *H01L 21/76275* (2013.01); *H01L 21/76283* (2013.01);
(Continued)

(58) Field of Classification Search
CPC ............ H01L 27/1207; H01L 27/0924; H01L 27/1211; H01L 29/42392; H01L 29/7869;
(Continued)

(56) References Cited

U.S. PATENT DOCUMENTS

| 8,802,504 B1 | 8/2014 | Hou et al. |
| 8,803,292 B2 | 8/2014 | Chen et al. |

(Continued)

FOREIGN PATENT DOCUMENTS

| JP | 2008227026 A | 9/2008 |
| JP | 2009200471 A | 9/2009 |

*Primary Examiner* — Timor Karimy
(74) *Attorney, Agent, or Firm* — Haynes and Boone, LLP

(57) ABSTRACT

The present disclosure provides a semiconductor structure. The semiconductor structure includes a semiconductor substrate having a first region and a second region; a first fin active region of a first semiconductor material disposed within the first region, oriented in a first direction, wherein the first fin active region has a <100> crystalline direction along the first direction; and a second fin active region of a second semiconductor material disposed within the second region and oriented in the first direction, wherein the second fin active region has a <110> crystalline direction along the first direction.

20 Claims, 11 Drawing Sheets

Related U.S. Application Data

(60) Provisional application No. 62/526,471, filed on Jun. 29, 2017.

(51) Int. Cl.
| | |
|---|---|
| *H01L 27/092* | (2006.01) |
| *H01L 21/762* | (2006.01) |
| *H01L 21/84* | (2006.01) |
| *H01L 29/423* | (2006.01) |
| *H01L 29/786* | (2006.01) |
| *H01L 29/78* | (2006.01) |
| *H01L 29/04* | (2006.01) |
| *H01L 29/06* | (2006.01) |

(52) U.S. Cl.
CPC ........... *H01L 21/823807* (2013.01); *H01L 21/823821* (2013.01); *H01L 21/845* (2013.01); *H01L 27/0924* (2013.01); *H01L 27/1211* (2013.01); *H01L 29/42392* (2013.01); *H01L 29/7869* (2013.01); *H01L 21/823878* (2013.01); *H01L 29/045* (2013.01); *H01L 29/0673* (2013.01); *H01L 29/7853* (2013.01)

(58) Field of Classification Search
CPC ............ H01L 29/045; H01L 29/0673; H01L 29/7853; H01L 21/76275; H01L 21/76283; H01L 21/823807; H01L 21/823821; H01L 21/845; H01L 21/823878

See application file for complete search history.

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2008/0227241 | A1* | 9/2008 | Nakabayashi ...... H01L 27/1211 438/150 |
| 2016/0181395 | A1 | 6/2016 | Liu et al. |
| 2017/0047331 | A1* | 2/2017 | Chen ................ H01L 29/7842 |
| 2017/0148629 | A1* | 5/2017 | Cheng ............... H01L 29/0649 |

* cited by examiner

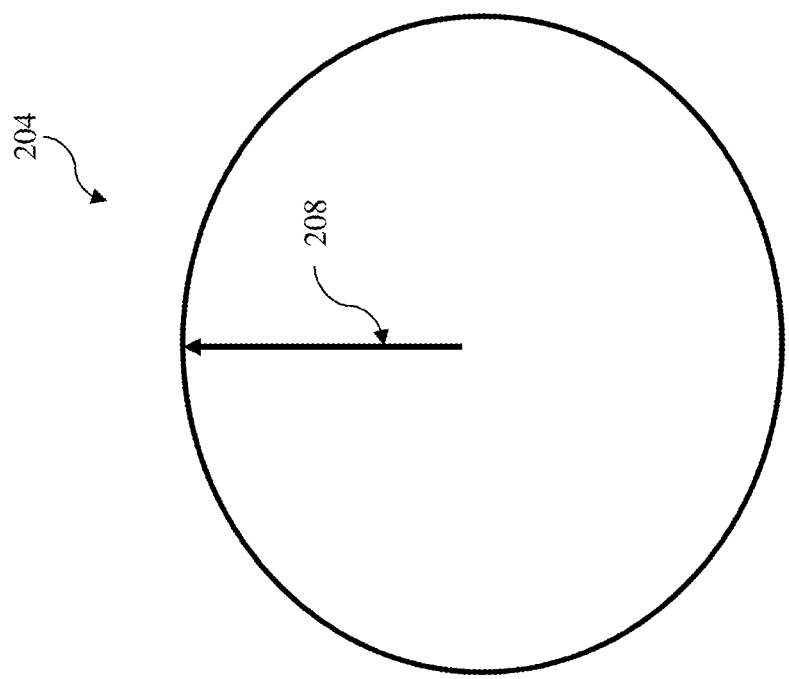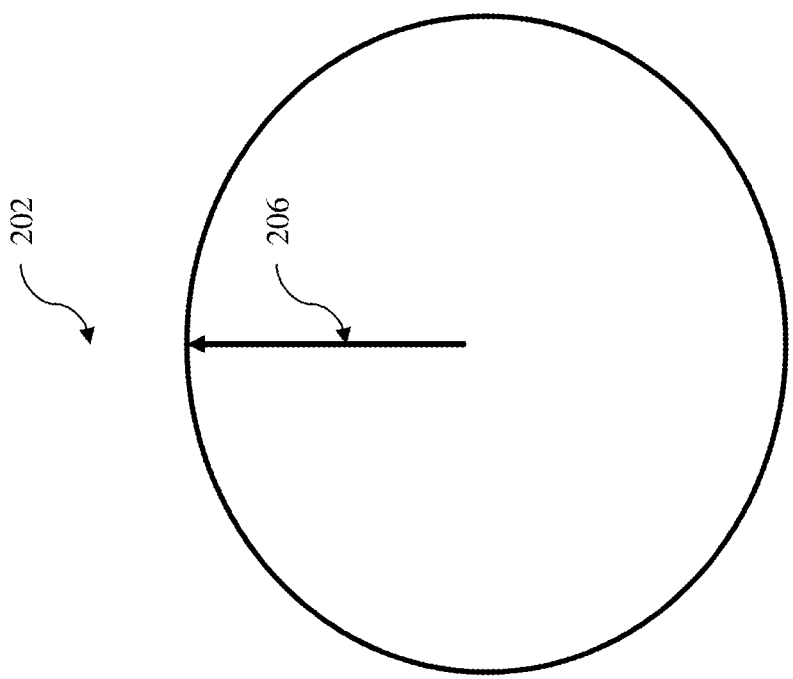
FIG. 2

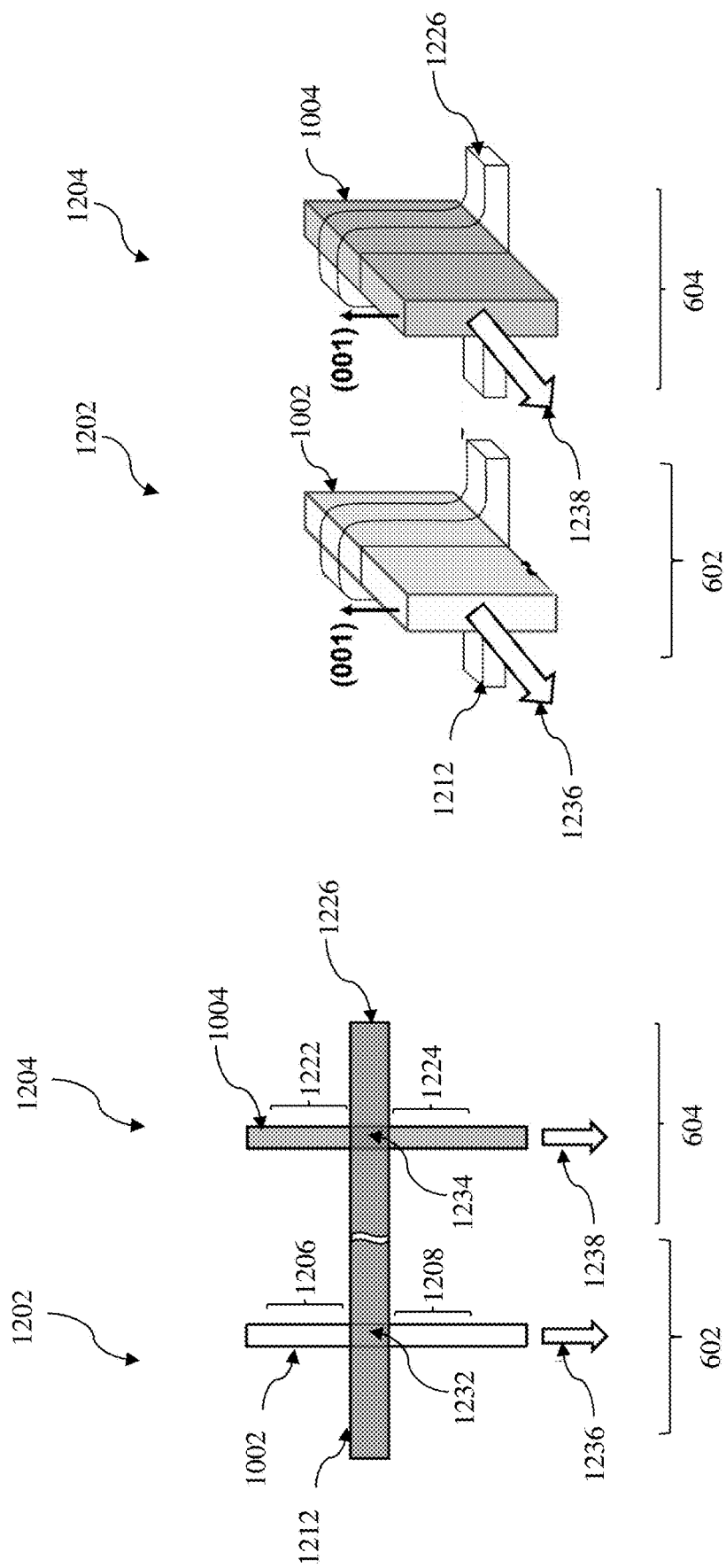

INTEGRATED CIRCUIT STRUCTURE AND METHOD WITH HYBRID ORIENTATION FOR FINFET

This application is a Divisional of U.S. patent application Ser. No. 15/800,390, filed Nov. 1, 2017, which further claims priority to U.S. Provisional Patent Application Ser. No. 62/526,471, entitled "Integrated Circuit Structure and Method with Hybrid Orientation for FinFET," filed on Jun. 29, 2017, the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized. Similar developments in IC processing and manufacturing are needed. For example, a three-dimensional transistor, such as a fin-like field-effect transistor (FinFET), has been introduced to replace a planar transistor. Furthermore, the carrier mobility is desired to increase for device speed and performance. However, the existing structures and associated methods are not proper to the 3D structure including FinFETs.

Although existing FinFET devices and methods of fabricating FinFET devices have been generally adequate for their intended purposes, they have not been entirely satisfactory in all respects. For example, the existing structures and associated methods are improper or not optimized to the 3D structure including FinFETs, especially for the high mobility channel. Therefore, what are needed are an integrated circuit structure and the method making the same to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a top view of two semiconductor substrates to be bonded to form a semiconductor structure, constructed in accordance with some embodiments.

FIG. 12A is a top view of the semiconductor structure, in portion, in accordance with some embodiments.

FIG. 12B is a perspective view of the semiconductor structure, in portion, in accordance with some embodiments.

DETAILED DESCRIPTION

Figure 1:
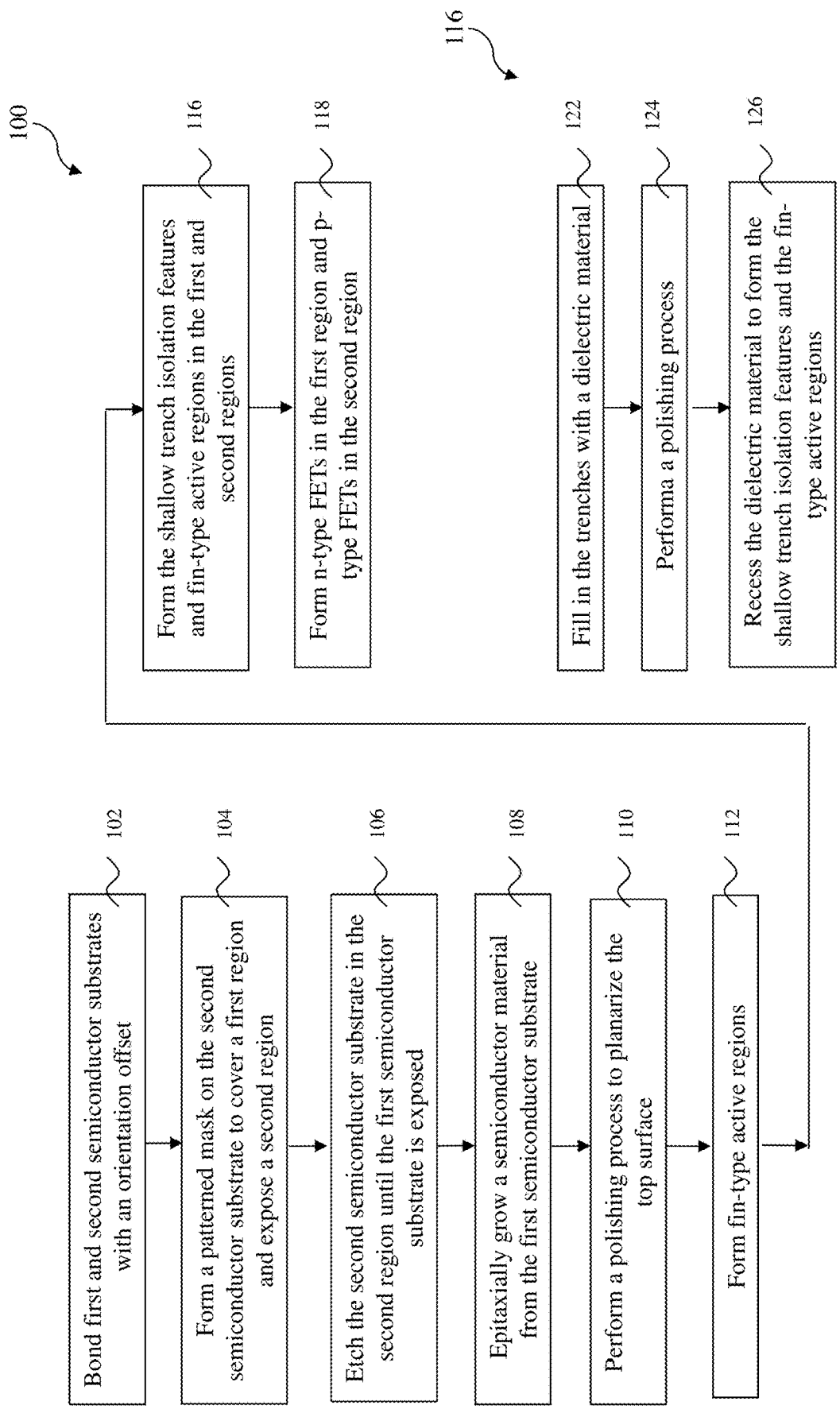
FIG. 1 is a flowchart of an integrated circuit fabrication method in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 3:
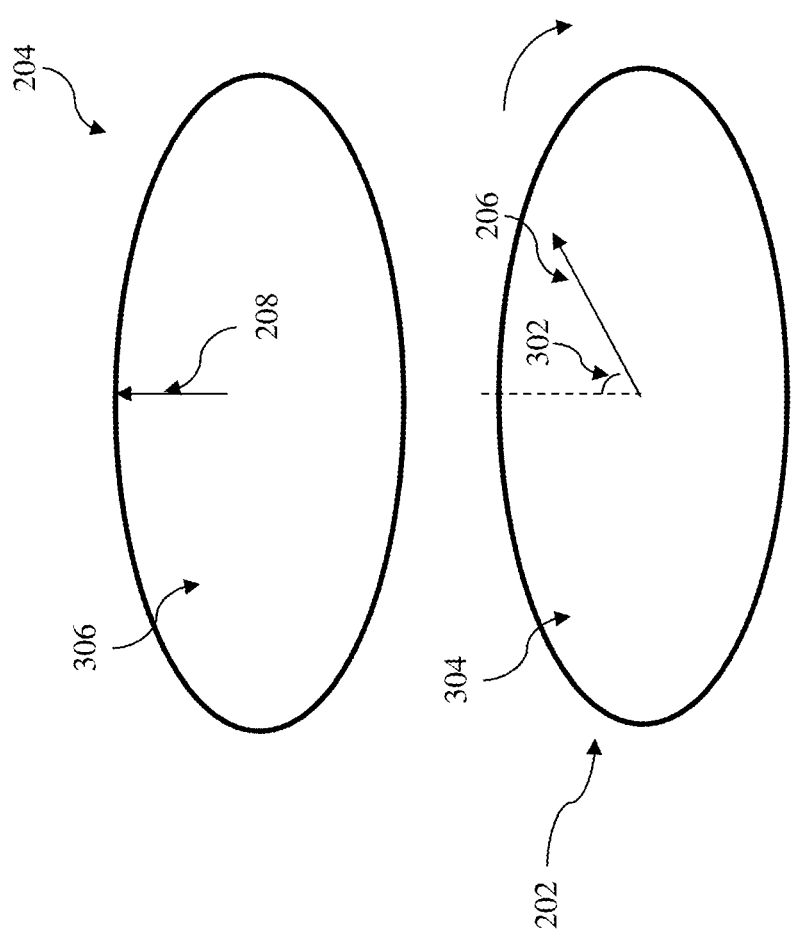
FIG. 3 is a perspective view of the two semiconductor substrates to be bonded to form the semiconductor structure, constructed in accordance with some embodiments.
Figure 4:
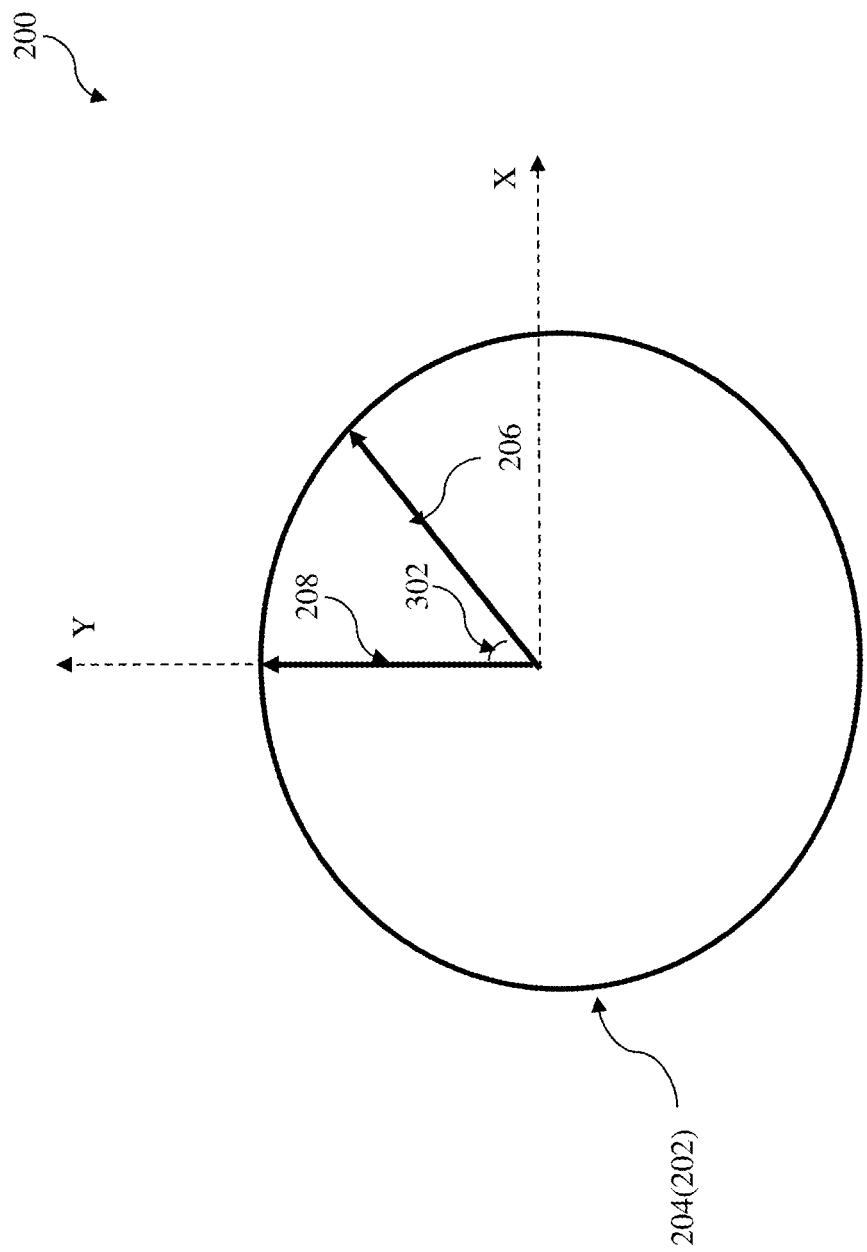
FIG. 4 is a top view of the semiconductor structure at a fabrication stage, constructed in accordance with some embodiments.
Figure 13B:
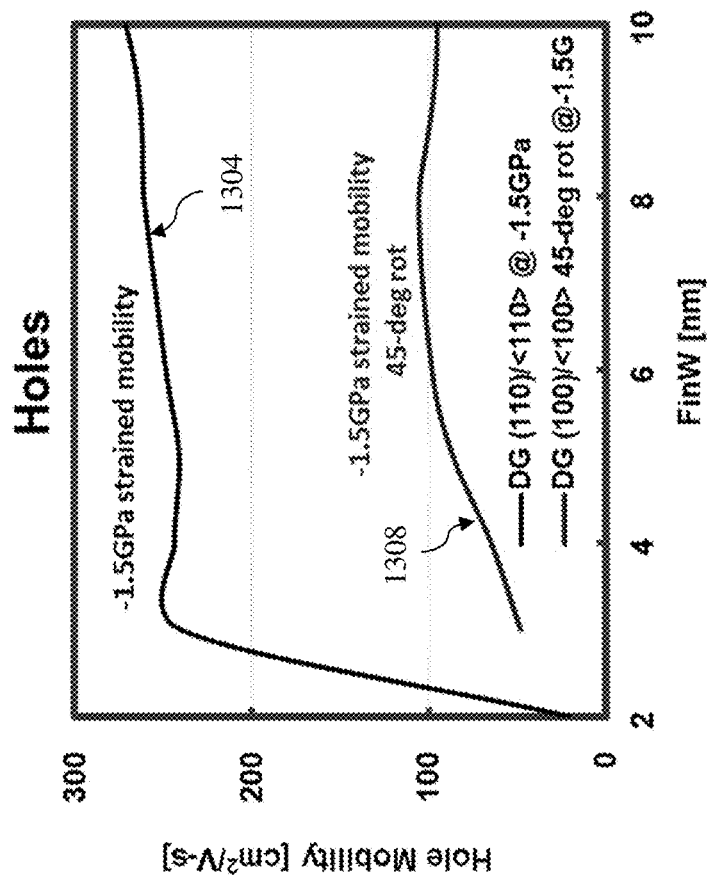
FIGS. 13A and 13B are diagrams illustrating experimental data of the semiconductor structure, constructed in accordance to some examples.
Figure 13A:
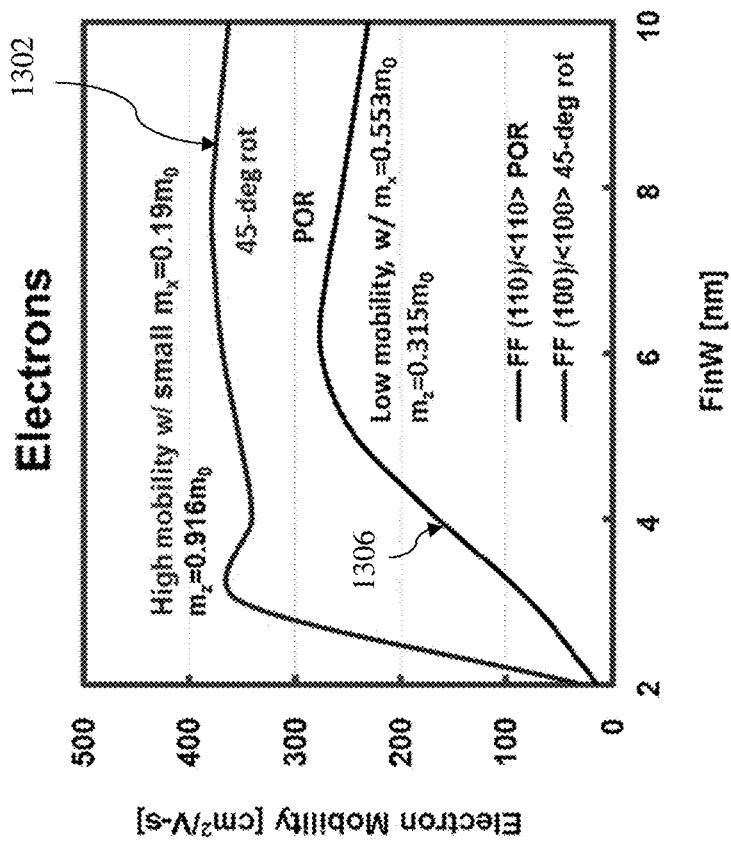

FIG. 1 is a flowchart of a method 100 for fabricating a semiconductor structure (particularly including a FinFET structure having one or more FinFET devices) 200, constructed in accordance with some embodiments. In accordance with some embodiments, FIG. 2 is a top view of the two semiconductor substrate to be boned to form the semiconductor structure 200; FIG. 3 is a perspective view of the two semiconductor substrates to be bonded. FIG. 4 is a top view of the semiconductor structure 200 at a fabrication stage. FIGS. 5 through 11 are sectional views of the semiconductor structure 200 at various fabrication stages. FIG. 12A is a top view of the semiconductor structure 200, in portion. FIG. 12B is a perspective view of the semiconductor structure 200, in portion. FIGS. 13A and 13B are diagrams illustrating experimental data of the semiconductor structure 200 according to some examples. It is understood that additional steps may be implemented before, during, and after the method, and some of the steps described may be replaced or eliminated for other embodiments of the method. The semiconductor structure 200 and the method 100 making the same are collectively described with reference to FIGS. 1 through 13B.

The method 100 begins with two semiconductor substrates 202 and 204, as illustrated in FIG. 2 in a top view. Particularly, the first semiconductor substrate 202 and the second semiconductor substrate 204 are the same in terms of crystalline structure and plane orientation. In the present embodiment, the first semiconductor substrate 202 and the second semiconductor substrate 204 are both silicon substrates, such as silicon wafers. In furtherance of the present embodiment, the first semiconductor substrate 202 and the second semiconductor substrate 204 are silicon wafers in crystalline structure with a same plane orientation, such as (100) in the present example. Here (xyz) is a miller index representing a plane orientation of the top surface of the crystalline silicon wafer. Accordingly, the crystal directions <100> of the semiconductor substrates 202 and 204 are oriented in the top surface of the respective substrate and are labeled as 206 and 208, respectively, as illustrated in FIG. 2. Here <100> is another miller index representing a family of crystal directions of a crystalline semiconductor substrate.

Even though the two semiconductor substrates are silicon substrates in the present embodiment. However, the disclosed structure and the method are not limiting and are extendable to other suitable semiconductor substrates and other suitable orientations. For examples, the substrate 210 may include an elementary semiconductor, such as germanium in a crystalline structure; a compound semiconductor, such as silicon germanium, silicon carbide, gallium arsenic, gallium phosphide, indium phosphide, indium arsenide, and/or indium antimonide; or combinations thereof. In furtherance of the embodiments, those semiconductor material films may be epitaxially grown on the silicon wafer.

Referring to FIG. 1, the method 100 includes an operation 102 to bond the two semiconductor substrates 202 and 204 with an orientation offset. In the present embodiment, the two substrates 202 and 204 are bonded together in a way such that a same crystal direction (such as <100>) of the two substrates 202 and 204 has a 45° degree angle. The operation 102 is further described below in details.

The first substrate 202 and the second substrate 204 are rotated and configured so that the corresponding <100> crystal directions are offset with an angle 302 therebetween, as illustrated in FIG. 3. The angle 302 is 45° degree. In the present embodiment, the top surface 304 of the first substrate 202 and the top surface 306 of the second substrate 204 are configured in a way that both face a same direction, as illustrated in FIG. 3.

The two substrates 202 and 204 are bonded together with such configuration through a proper bonding technology, such as direct bonding, eutectic bonding, fusion bonding, diffusion bonding, anodic bonding or other suitable bonding method. In one embodiment, the substrates are bonded together by direct silicon bonding (DSB). For example, the direct silicon bonding process may include preprocessing, pre-bonding at a lower temperature and annealing at a higher temperature. A buried silicon oxide layer (BOX) may be implemented when the two substrates are bonded together. In some examples, a thermal silicon oxide film is formed on one bonding surface (or both bonding surfaces: the top surface of the first substrate 202 and the bottom surface of the second substrate 204) by thermal oxidation. Then the bonding surfaces are positioned with the orientation and configuration as described above in FIG. 3. The bonding surfaces are brought together and bonded by thermal heating and mechanical pressure. The thermal heating may have a temperature at or greater than 1000° C. The thermal heating and mechanical pressure may have different profiles during the bonding process to optimize the bonding effect. For example, the bonding process may include two steps: the first step at room temperature with a mechanical pressure and the second step with a thermal annealing greater than 1000° C. In some examples, at least one of the semiconductor substrates 202 and 204 may be thinned down, such as by grinding or polishing, to proper thicknesses before or after the bonding. In an alternative embodiment, the buried oxide layer may be eliminated in a way that the silicon surfaces are directly bonded together. In another embodiment, the thermal annealing temperature may be reduced to a relatively lower temperature, such as a temperature between 400° C. and 450° C.

The bonded two substrates are illustrated in FIG. 4 in a top view. X and Y directions are Cartesian coordinate and defined on the (100) plane surface. The <100> crystal direction 208 of the second substrate 204 is along the Y axis while the <100> crystal direction 206 of the first substrate 202 is along a diagonal direction between X and Y axes with the angle 302 of 45° degree from the Y axis. Particularly, the first substrate 202 has the crystal direction <110> along the Y axis.

Figures 5, 6:
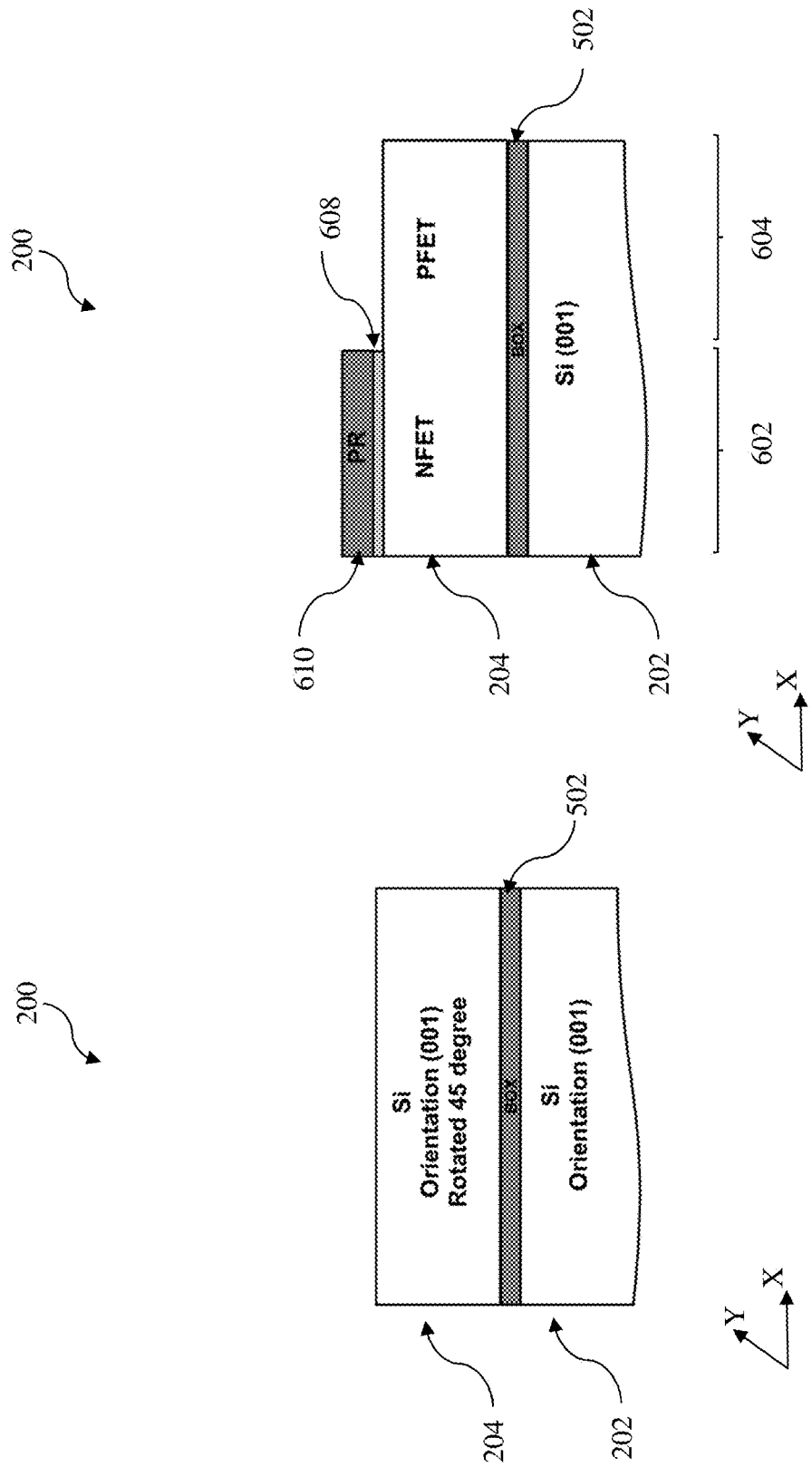
FIGS. 5, 6, 7, 8, 9, 10 and 11A are sectional views of the semiconductor structure at various fabrication stages, constructed in accordance with some embodiments.

FIG. 5 is a sectional view of the semiconductor structure 200 having the first substrate 202 and the second substrate 204 bonded together. In the present embodiment, the silicon oxide film 502 is interposed between the two substrates. Again, the top surfaces of the substrates are (100) oriented but the first substrate 202 has a rotation of 45° to the second substrate 204 so that the first substrate 202 has the crystal direction <110> along the Y axis and the second substrate 204 has the crystal direction <100> along the Y axis.

Referring to FIGS. 1 and 6, the method 100 proceeds to an operation 104 to form a patterned mask on the second substrate 204 of the semiconductor structure 200. The semiconductor structure 200 includes a first region 602 for an n-type field-effect transistor (NFET) and a second region 604 for a p-type field-effect transistor (PFET). The patterned mask covers the first region 602 and includes an opening that exposes the second region 604. The patterned mask may be a soft mask (such as a patterned resist layer) or a hard mask (such as a dielectric material layer). In the present embodiment, the hard mask is used. A hard mask 608 is disposed on the top surface of the second substrate 204; a patterned resist layer 610 is formed on the hard mask 608 by a lithography process; and the hard mask 608 is etched to transfer the opening from the patterned resist layer 610 to the hard mask 608. In some examples, the hard mask 608 includes a silicon oxide and a silicon nitride subsequently deposited on the semiconductor structure 200. The hard mask 608 may be formed by thermal oxidation, chemical vapor deposition (CVD), atomic layer deposition (ALD), any other appropriate method, or a combination thereof. An exemplary photolithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In some other embodiments, the patterned resist layer may be directly used as an etch mask for the subsequent etch process. The patterned resist layer 610 may be removed by a suitable process, such as wet stripping or plasma ashing, after the formation of the hard mask 608.

Figure 7:
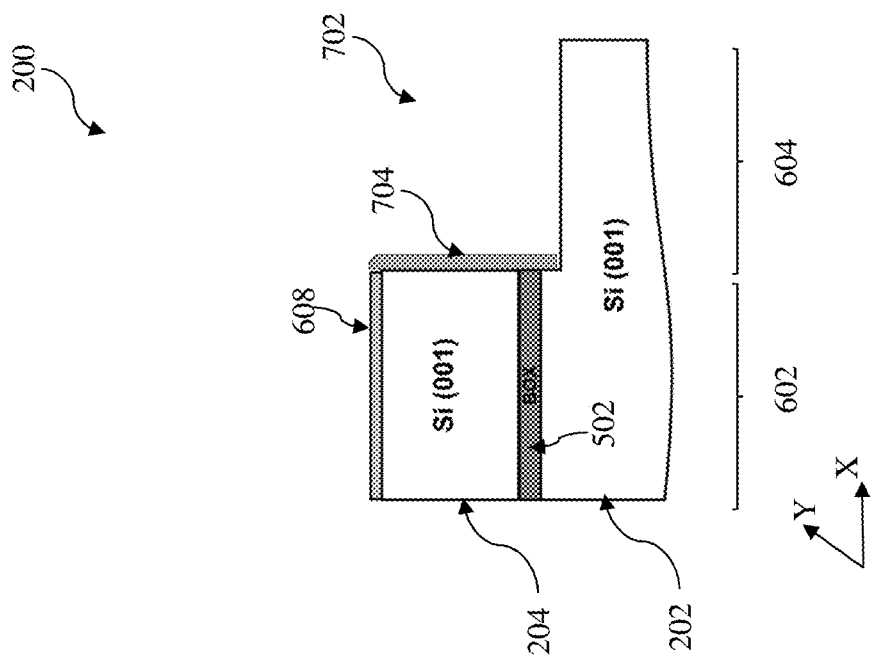

Referring to FIGS. 1 and 7, the method 100 includes an operation 106 to etch the second semiconductor substrate 204 in the second region 604 until the first substrate 202 is exposed within the second region 604, resulting in a trench 702. The etching process is designed to selectively remove the semiconductor material(s) in the second region 604 using the hard mask 608 as an etch mask. The etching process may further continue to recess the first semiconductor substrate 202 or ensure the first semiconductor substrate 202 within the second region 604 is exposed. The etching process may include dry etch, wet etch or a combination thereof. The patterned mask 608 protects the second substrate 204 within the first region 602 form etching. In various examples, the etching process includes a dry etch with a suitable etchant, such as fluorine-containing etching gas or chlorine-containing etching gas, such as $Cl_2$, $CCl_2F_2$, $CF_4$, $SF_6$, $NF_3$, $CH_2F_2$ or other suitable etching gas. In some other examples, the etching process includes a wet etch with a suitable etchant, such KOH solution. The etching process may include more than one step. For example, the etching process may include a first etching step to etch the silicon material of the second substrate 204 and a second etching step to etch the silicon oxide layer 502. In furtherance of the example, the etching process includes a dry etch step using fluorine-containing etching gas or chlorine-containing etching gas to etch silicon and a wet etch step using hydrofluoric acid solution to etch silicon oxide. In some embodiments, a spacer 704 may be formed on sidewalls of the trench 702. The spacer 704 may include a dielectric material to on the sidewall of the trench 702 so that the subsequent epitaxial grown semiconductor material in the trench 702 can carry the crystal orientation from the first semiconductor substrate 202 without being impacted by the second substrate 204. Furthermore, the spacer 704 provides isolation between the first region 602 and the second region 604. The spacer 704 may be formed by a procedure that includes deposition (such as CVD or PVD) and anisotropic etching, such as dry etching. In some examples, the spacer 704 includes silicon nitride, silicon oxide, titanium nitride or a combination thereof.

Figure 8:
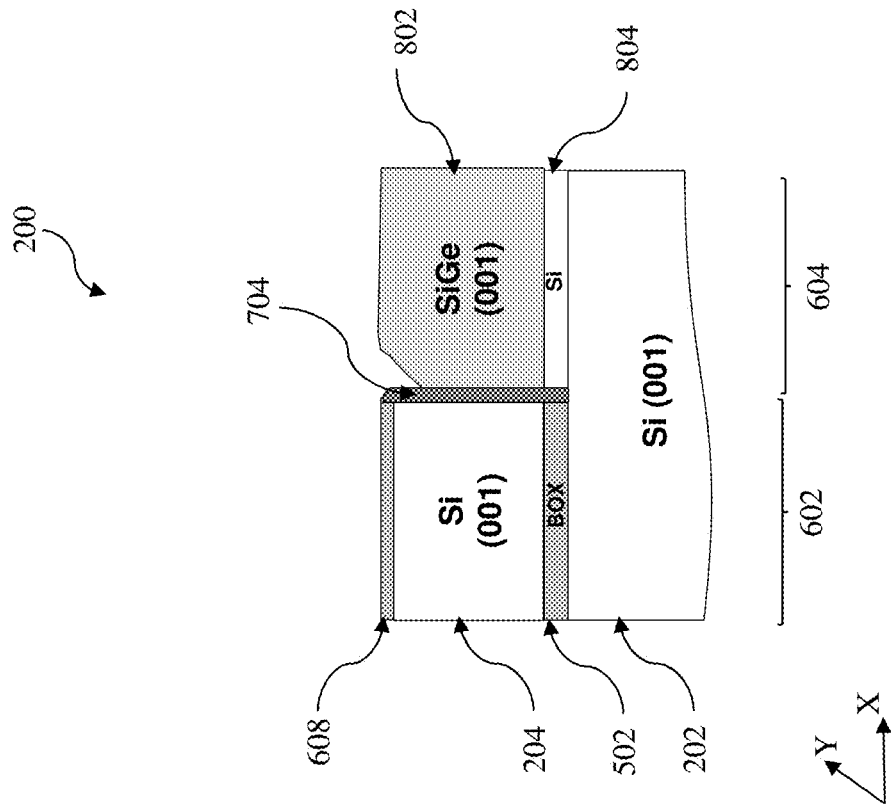

Referring to FIGS. 1 and 8, the method 100 proceeds to an operation 108 to epitaxially grow a semiconductor material 802 from the first semiconductor substrate 202 within the second region 604. The semiconductor material 802 fills in the trench 702. In one embodiment, the semiconductor material 802 is different from the semiconductor material of the second semiconductor substrate 204 to achieve strained effect for enhanced mobility. For example, the second semiconductor material 802 is silicon germanium (SiGe). In other examples, the second semiconductor material 802 may be silicon (Si), germanium (Ge) or other suitable elementary semiconductor material or compound semiconductor material. In some embodiment, the epitaxy growth in the operation 108 may include more than one step to grow multiple semiconductor layers with different semiconductor materials for enhanced device performance and other considerations. In the present embodiment, the operation 108 includes a first epitaxial growth of silicon to form a silicon layer 804 and a second epitaxial growth of SiGe to form a SiGe layer 802.

Figures 9, 10:
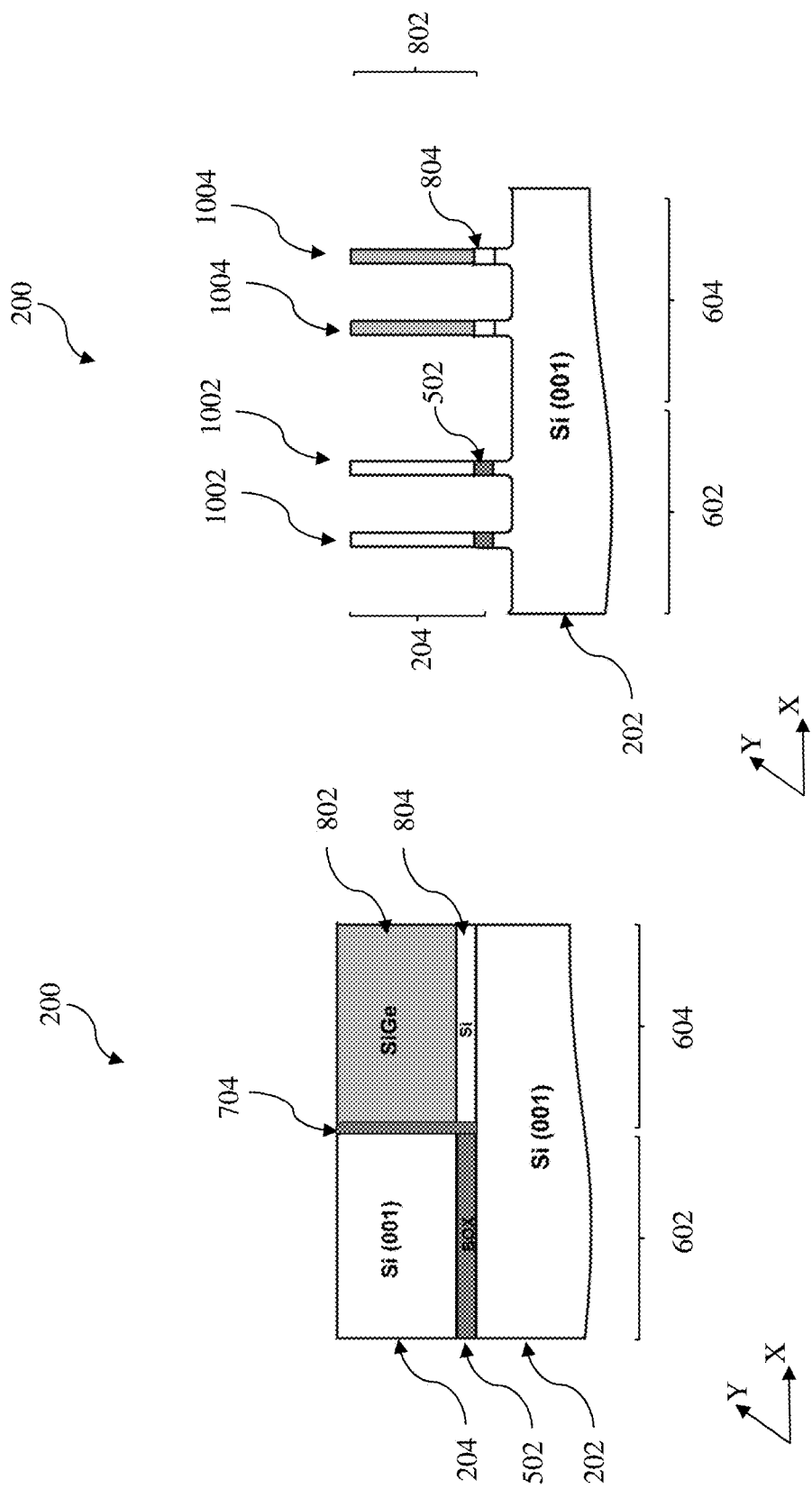

Referring to FIGS. 1 and 9, the method 100 may proceed to an operation 110 to perform a polishing process, such as chemical mechanical polishing (CMP) to planarize the top surface. The hard mask 608 may be used as a polishing stop layer during the CMP process and is removed by etching after the CMP. Alternatively, the hard mask 608 may be removed by the CMP process.

The semiconductor layer 802 vertically grows from the semiconductor layer 804 and substantially fills in the trench 702. In the present embodiment, there may be a gap between the semiconductor layer 802 and the spacer 704, due to the presence of the spacer 704. In this case, the polishing process in the operation 110 additionally eliminates or reduces such gap.

Since it is formed by epitaxial growth from the first semiconductor substrate 202 that has a rotation relative to the second semiconductor substrate 204, the semiconductor material 802 is in the crystalline structure and carries the same crystal orientations of the first semiconductor substrate 202. For example, the top surface of the second semiconductor material 802 within the second region 604 is still in the (100) crystal plane while the top surface of the second semiconductor substrate 204 within the first region 602 has the (100) crystal plane as well. However, the crystal directions for those two regions are different, due to the rotation. Particularly, the second semiconductor substrate 204 within the first region 602 has <100> crystal directions along both X and Y axes while the second semiconductor material 802 within the second region 604 has <100> crystal directions along the diagonal directions between X and Y axes. Furthermore, the second semiconductor material 802 within the second region 604 has crystal directions <110> oriented along the X and Y axes.

Referring to FIGS. 1 and 10, the method 100 may proceed to an operation 112 to form fin-type active regions 1002 within the first region 602 and fin-type active regions 1004 within the second region 604. The fin-type active regions (or simply referred to as fins or fin features) are three-dimensional (3D) semiconductor features where various devices, such as FETs, are formed thereon.

In some embodiments, the fins 1002 and 1004 are formed by any suitable procedure including deposition, photolithography, and/or etching processes. In one embodiment, the fins 1002 and 1004 are formed by patterning the semiconductor structure 200 (the second substrate 204 in the first region 602 and the semiconductor material 802 in the second region 604) to form trenches. In furtherance of the embodiment, the patterning of the semiconductor structure 200 may include forming a hard mask; and applying an etch process to the semiconductor structure 200 through the openings of the hard mask to form trenches in the semiconductor structure 200. The hard mask may be formed by a procedure that includes depositing a hard mask material layer and etching the hard mask material layer. In some examples, the hard mask material layer includes a silicon oxide layer and a silicon nitride layer subsequently deposited on the semiconductor structure 200. The hard mask material layer may be formed by thermal oxidation, chemical vapor deposition (CVD), atomic layer deposition (ALD), or any other appropriate method. The procedure to form the patterned hard mask further includes forming a patterned photoresist (resist) layer by a lithography process, and etching the hard mask material layer through the openings of the patterned resist layer to transfer the openings to the hard mask material layer. In some other embodiments, the patterned resist layer may be directly used as an etch mask for the etch process to form the trenches. The etching process may include more than one step and may continue to etch through the silicon oxide layer 502 within the first region 602 and the silicon layer 802 within the second region 604 to reach the first semiconductor substrate 202, as illustrated in FIG. 10.

The fins 1002 within the first region 602 may be referred to as n-type fins because the semiconductor material therein is doped appropriately to form NFETs. Specifically, the semiconductor material is doped with a p-type dopant such as boron. Similarly, the fins 1004 within the second region 604 may be referred to as p-type fin features because they will ultimately be doped appropriately to form a p-type transistor. Specifically, they will be doped with an n-type dopant such as phosphorous. The dopants may be introduced into the respective regions by ion implantation or in-situ doping.

The fins have elongated shape and are oriented in the Y direction. Particularly, the n-type fins 1002 have crystal direction <100> in the Y direction while the p-type fins 1004 have crystal direction <110> in the Y direction, due to the rotation described above. Furthermore, both X and Y directions of the n-type fins 1002 have crystal direction <100> and both X and Y directions of the p-type fins 1004 have crystal direction <110>. Additionally, the sidewall surface orientations of the n-type fin 1002 and the p-type fins are (001) and (110), respectively, as illustrated in FIG. 10.

Figure 11A:
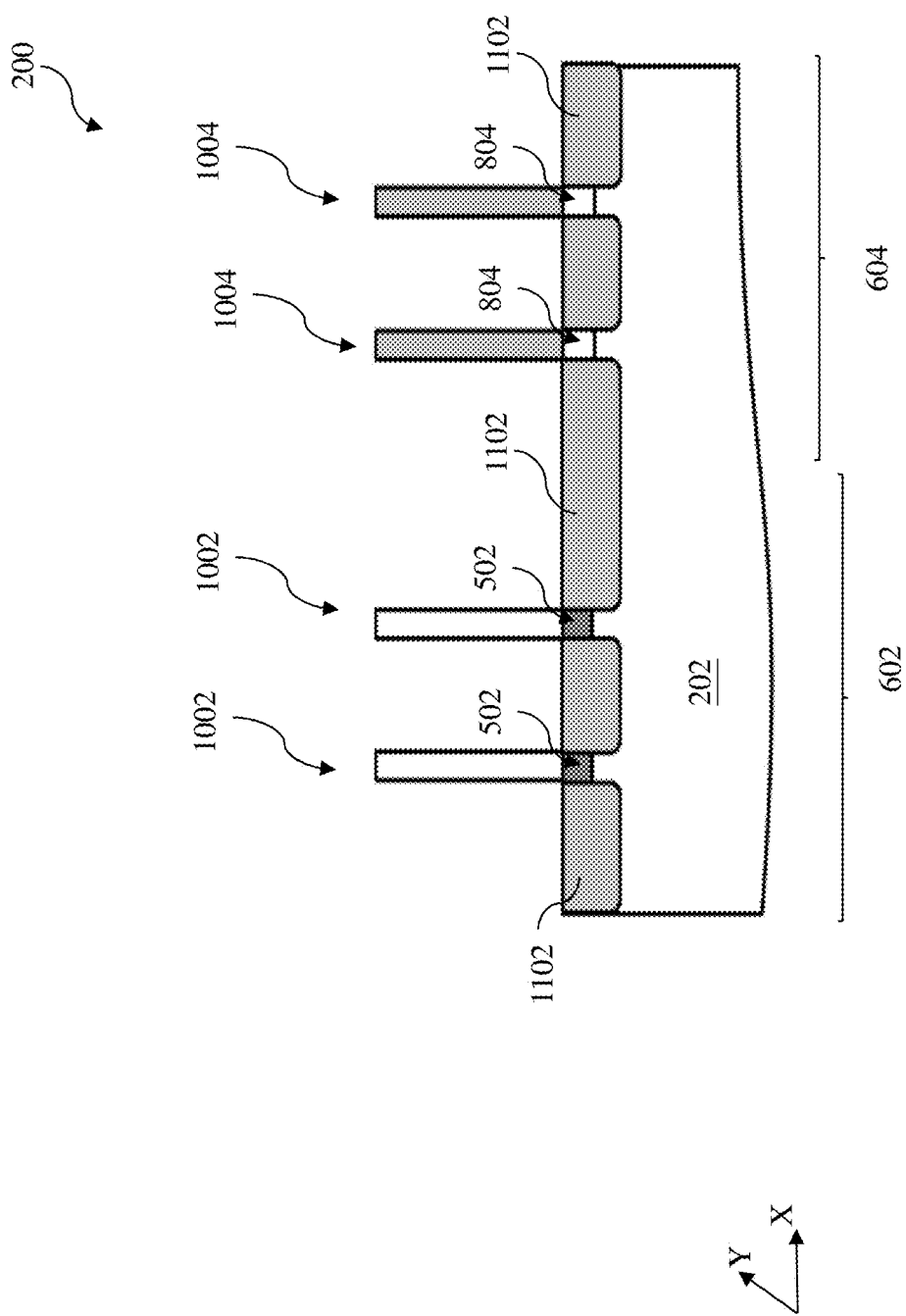

Referring to FIGS. 1 and 11A, the method 100 may proceed to an operation 116 to form shallow trench isolation (STI) features 1102 to isolate various fin-type active regions. The formation of the STI features 1102 may further includes a first operation 122 to fill in the trenches between fins with one or more dielectric material; a second operation 124 to polish the semiconductor structure 200 for removing excessive dielectric material and planarizing the top surface; and a third operation 126 to recess the STI features 1102 by selective etching. The second operation 124 to fill in the trenches with the dielectric material(s) may include one or more steps to fill in with respective dielectric materials. For example, a thermal silicon oxide layer is formed in the trenches with a thermal oxidation process and another dielectric material, such as silicon oxide, fills in the trenches by a suitable technique that includes CVD, such as high density plasma CVD (HDPCVD) or flowable CVD (FCVD). The third operation 126 to recess the dielectric material may include an etching process (such as wet etching, dry etching a combination thereof) to selectively etch back the dielectric material, resulting in the STI features 1102.

Figure 11B:
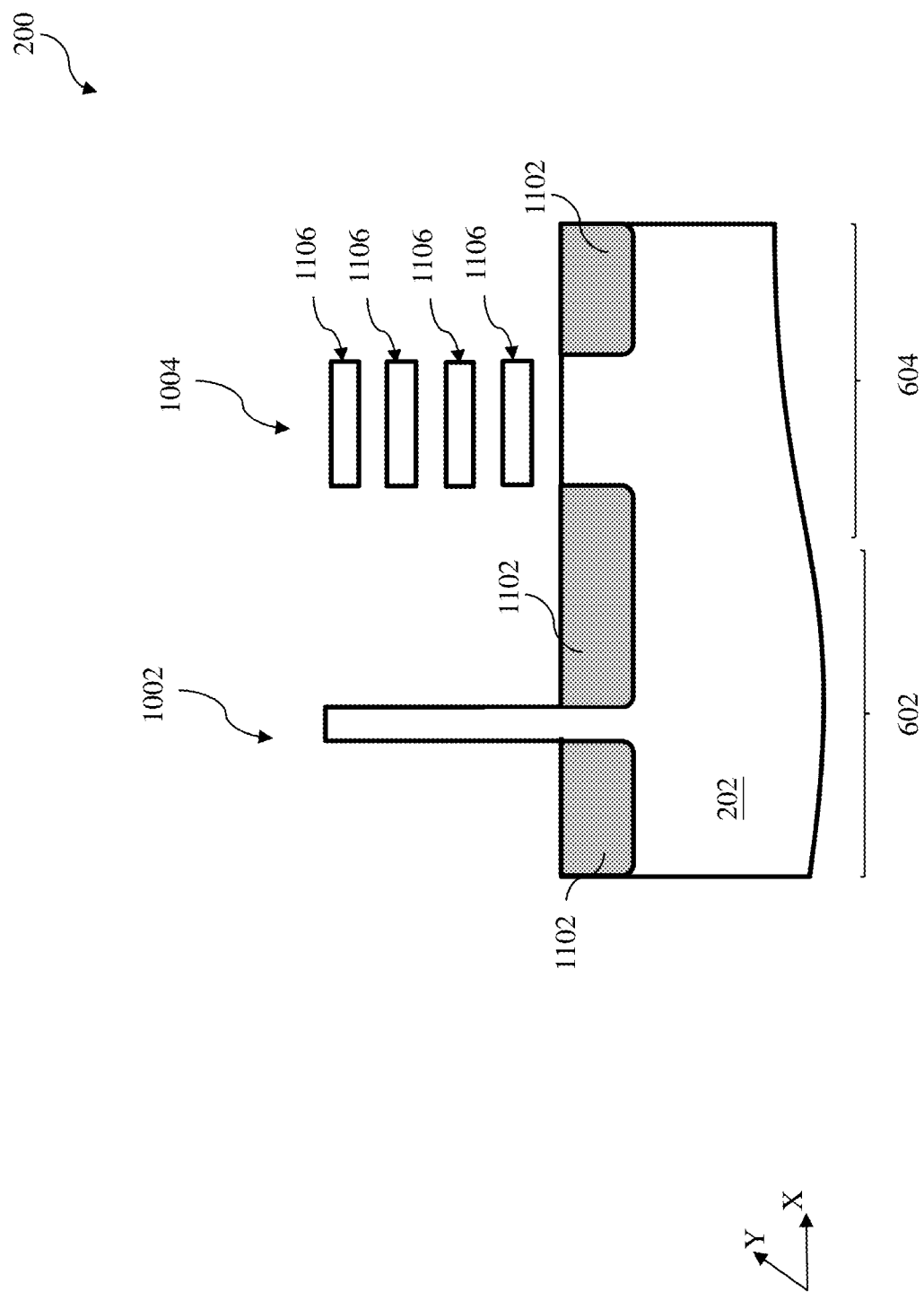
FIG. 11B is a sectional view of the semiconductor structure constructed in accordance with other embodiments.

Alternatively, the semiconductor structure 200 may have a different structure, such as one illustrated in FIG. 11B. In the semiconductor structure 200 of FIG. 11B, the fin active region 1004 is replaced by a plurality of stacked nanowires 1106, accordingly a plurality of channels defined in the nanowires 1106. The formation of the nanowires 1106 is further described here according to some examples. In the operation 108, the epitaxy growth includes epitaxially growing alternative semiconductor materials, such as Si/SiGe/Si/SiGe. In operation 112, the formation of the fin active regions includes patterning of the semiconductor materials (as described above) and further includes a selective etching process to selectively remove only one semiconductor material while another remains, such as selectively removing Si (or selectively removing SiGe in an alternative example), thereby forming the nanowires 1106. Thus, various devices, such as FETs, may be formed on the fins 1002/1004 of FIG. 11A or alternatively may be formed on the fins 1002 and nanowires 1106 of FIG. 11B.

Referring back to FIG. 1, the method 100 may proceed to an operation 118 to form NFETs on the n-type fins 1002 within the first region 602 and PFETs on the p-type fins 1004 (or nanowires 1106) within the second region 604. Alternatively, various semiconductor devices, such as FETs, dipole transistors, diodes, passive devices (resistors, inductors, capacitors or a combination thereof), or a combination thereof are formed on the fins. In the present embodiment illustrated in FIGS. 12A and 12B, exemplary NFET 1202 and PFET 1204 are formed on the fins 1002 and 1004, respectively, and therefore are referred to as fin FETs (FinFETs). FIG. 12A is a top view and FIG. 12B is a schematic view of the semiconductor structure 200 in accordance with some embodiments. In FIGS. 12A and 12B, only one n-type fin FET (NFinFET) 1202 within the first region 602 and one p-type fin PFET (PFinFET) 1204 within the second region 604 are provided for illustration.

Specifically, the NFinFET 1202 is formed on the fin 1002 within the first region 602. The NFinFET 1202 includes source 1206 and drain 1208 formed on the fin 1002, and a gate 1212 interposed between the source 1206 and drain 1208. Similarly, the PFinFET 1204 is formed on the fin 1004 within the second region 604. The PFinFET 1204 includes source 1222 and drain 1224 on the fin 1004, and a gate 1226 interposed between the source 1222 and drain 1224.

Particularly, the channel for each FinFET is defined in the portion of the corresponding fin interposed between the source and drain, and underlying the gate. In the present embodiment, the NFinFET 1202 has a first channel 1232 in the fin 1202 and the PFinFET 1204 has a second channel 1234 in the fin 1204. For the NFinFET 1202, the carriers (electrons) flow through the channel 1232 from the source 1206 to the drain 1208 along the direction 1236 that is the crystal direction <100>. For the PFinFET 1204, the carriers (holes) flow through the channel 1234 from the source 1222 to the drain 1224 along the direction 1238 that is the crystal direction <110>. By providing the semiconductor structure 200 having NFinFETs and PFinFETs with respective crystal directions for channels, the carrier mobility and device performance are enhanced.

The structure and formation of the FinFETs are further described below. The gate 1212 in the first region 602 includes a gate dielectric feature disposed on the channel and a gate electrode disposed on the gate dielectric feature. The gate may further include gate spacers disposed on sidewalls of the gate electrode. The gate dielectric feature includes a gate dielectric material, such as silicon oxide or a suitable dielectric material having a higher dielectric constant (high-k dielectric material). In the present embodiment, the gate dielectric feature includes more than one dielectric material layers. For example, the gate dielectric feature includes an interfacial dielectric layer, such as silicon oxide, and a high-k dielectric material layer on the interfacial layer.

The gate electrode includes a conductive material layer, such as doped polysilicon, metal, metal alloy, metal silicide, or a combination thereof. In some embodiments, the gate electrode includes more than one conductive material layers. For example, the gate electrode includes a first conductive layer having a suitable work function on the gate dielectric feature and a second conductive layer on the first conductive layer. In one example for the n-type FinFET, the first conductive layer includes titanium or titanium aluminum. In another example, the second conductive layer includes aluminum, tungsten, copper, doped polysilicon or a combination thereof.

Similarly, the gate 1226 in the second region 604 also includes a gate dielectric layer and a gate electrode. The gate electrode in the second region 604 may have a similar structure as that of the gate 1212 in the first region 602. However, the conductive material(s) may be different. For examples, in the second region 604, the gate electrode includes a first conductive material layer (such as tantalum nitride or titanium nitride), and a second conductive material layer (such as aluminum, tungsten, copper, doped polysilicon or a combination thereof). The first conductive layers for NFET and PFET are designed with different work functions for optimized threshold voltages.

The gate (1212 or 1226) is formed by a procedure that includes various deposition processes and patterning. The formation of the gate is further described in accordance with some embodiments. In one embodiment, an interfacial layer is formed on the semiconductor substrate (particularly, on the channel). The interfacial layer may include silicon oxide formed by a proper technique, such as an atomic layer deposition (ALD), thermal oxidation or UV-Ozone Oxidation. The interfacial layer may have a thickness less than 10 angstrom. A high k dielectric material layer is formed on the interfacial layer. The high-k dielectric layer includes a dielectric material having the dielectric constant higher than that of thermal silicon oxide, about 3.9. The high k dielectric material layer is formed by a suitable process such as ALD or other suitable technique. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides. The interfacial layer and the high k dielectric material layer constitute the gate dielectric layer.

In some embodiments, the gate electrode includes polysilicon. A polysilicon layer is formed on the gate dielectric layer by a proper technique, such as CVD. In one example, a capping layer may be further formed between the high k dielectric material layer and the polysilicon layer by a proper technique, such as PVD. The capping layer may include titanium nitride (TiN), tantalum nitride (TaN) or a combination thereof in some examples. The capping layer may serve one or more functions, such as diffusion barrier, etch stop, and/or protection.

After the depositions, the gate material layers are patterned to form the gate stack (or a plurality of gate stacks). The patterning of the gate stack includes a lithography process and etching. A lithography process forms a patterned resist layer. In one example, the lithography process includes resist coating, soft baking, exposing, post-exposure baking (PEB), developing, and hard baking. The gate stack material layers are thereafter patterned by etching using the patterned resist layer as an etching mask. The etching process may include one or more etching steps. For example, multiple etching steps with different etchants may be applied to etch respective gate stack material layers.

In other embodiments, the patterning of the gate stack material layers may alternatively use a hard mask as an etching mask. The hard mask may include silicon nitride, silicon orynitride, silicon oxide, other suitable material, or a combination thereof. A hard mask layer is deposited on the gate stack material layers. A patterned resist layer is formed on the hard mask layer by a lithography process. Then, the hard mask is etched through the opening of the patterned resist layer, thereby forming a patterned hard mask. The patterned resist layer may be removed thereafter using a suitable process, such as wet stripping or plasma ashing.

The gate spacers include a dielectric material and may have one or more films. In some embodiments, the fate spacers include silicon oxide, silicon nitride, silicon oxynitride, other suitable dielectric material, or a combination thereof. The gate spacers are formed by deposition and anisotropic etch (such as dry etch).

In some embodiments, the source and drain features may further include light-doped drain (LDD) features formed in the fin feature by a suitable process, such as ion implantation. The LDD features have a doping type opposite to that of the channel. For example for an nFET, the channel is p-type and the LDD features are n-type. In another example for a pFET, the channel is n-type and the LDD features are p-type. The LDD features and the gate stack may be formed in a collective procedure. For examples, the gate stack material layers are deposited and patterned to form the gate dielectric layer and gate electrode layer; the LDD features are formed by ion implantation using the dummy gate stack (and STI features) to constrain the LDD features; and then the spacers are formed. In other embodiments, the LDD features are optional and may be eliminated from the semiconductor structure 200.

In some alternative embodiments, the gate stack may be formed by a gate replacement process. The gate replacement process include forming a dummy gate; forming source and drain features; removing the dummy gate; and thereafter forming a final gate that includes a gate dielectric layer of a high k dielectric material and a metal gate electrode. In various embodiments, the gate replacement process may be a high-k-last process, in which both the gate dielectric layer and the gate electrode in the dummy gate are removed and replaced by the final gate stack.

In some alternative embodiments, the source and drain features have different semiconductor material for strained effect and may be formed by a procedure that includes recessing the source and drain regions by etching; and filling the recesses with a different semiconductor (different from the channel material) by epitaxial growth. In some embodiments, the semiconductor material is chosen for proper strained effect in the channel region such that the corresponding carrier mobility is increased. For example, the semiconductor material for the source and drain features includes silicon carbide or silicon germanium.

The source and drain features may be formed by one or more ion implantations. The following description using the NMOS transistors as an example, and the formation of the source and drain features of MMOS transistors is similar. In some embodiments, the source and drain features for NMOS transistors are formed by an ion implantation procedure that includes a first ion implantation to form LDD features and a second ion implantation to form S/D features. In other embodiments, the formation of the gate stacks and the formation of the source and drain features are integrated in a collective procedure. In furtherance of the embodiments, the gate stacks are deposited and patterned; the first ion implantation is applied to the fin active regions to form LDD features; gate spacers are formed on sidewalls of the gate stacks by a suitable process (such as dielectric deposition and dry etching); and the second ion implantation is applied to the fin active regions to form S/D features.

The method 100 further includes other operations before, during and/or after the operations described above. For example, the method 100 further includes an operation to form an interlayer dielectric material (ILD) on the semiconductor structure 200. The ILD includes one or more dielectric materials, such as silicon oxide, a low k dielectric material or a combination thereof. In some embodiment, the formation of the ILD includes deposition and CMP.

The method 100 includes an operation to form a multilayer interconnection structure to couple various devices to form a functional circuit. The multilayer interconnection structure includes vertical interconnects, such as via features or contact features, and horizontal interconnects, such as metal lines. The various interconnection features may implement various conductive materials including copper, tungsten, and/or silicide. In one example, a damascene and/or dual damascene process is used to form a copper related multilayer interconnection structure.

The present disclosure provides a semiconductor structure and a method making the same. The semiconductor structure includes first fin-type active regions for NFinFETs and second fin-type active regions for PFinFETs. The first fin-type active region and second fin-type active regions have channels with different crystal directions, particularly, the channel of the NFinFET is along the crystal direction <100> and the channel of the PFinFET is along the crystal direction <110> for enhanced mobility and device performance. The method includes bonding two semiconductor substrates with a rotation such that the above crystal directions are achieved. Furthermore, the channel for PFinFET is also strained for the enhanced mobility by using silicon germanium for the channel.

The embodiments of the present disclosure offer advantages over existing art, though it is understood that other embodiments may offer different advantages, not all advantages are necessarily discussed herein, and that no particular advantage is required for all embodiments. By utilizing the disclosed method and structure, both the electron mobility for NFinFETs and the electron mobility for PFinFETs are enhanced as illustrated in FIGS. 13A and 13B according to some examples. FIG. 13A illustrates experimental data 1302 of an NFinFET 1202 for its electron mobility versus the width of the corresponding fin 1202. FIG. 13B illustrates experimental data 1304 of a PFinFET 1204 for its hole mobility versus the width of the corresponding fin 1204. The Data 1306 is reference data from an NFinFET with the channel along the <110> crystal direction and the Data 1308 is reference data from a PFinFET without strain from silicon germanium. From above experimental data, it is clearly show both the mobility for NFinFET 1202 and PFinFET 1204 are enhanced. Especially, the fins may be patterned to produce a relatively close spacing between features, for which the above disclosure is well suited. In addition, spacers used in forming fins of FinFETs, also referred to as mandrels, can be processed according to the above disclosure. In contrary, the existing method and structure for planar devices are not capable of providing combination to optimize and enhance both NFETs and PFETs.

Thus, the present disclosure provides a semiconductor structure in accordance with some embodiments. The semiconductor structure includes a semiconductor substrate having a first region and a second region; a first fin active region of a first semiconductor material disposed within the first region, oriented in a first direction, wherein the first fin active region has a <100> crystalline direction along the first direction; and a second fin active region of a second semiconductor material disposed within the second region and oriented in the first direction, wherein the second fin active region has a <110> crystalline direction along the first direction.

The present disclosure also provides a method making a semiconductor structure in accordance with some embodiments. The method includes bonding a first semiconductor substrate and a second semiconductor substrate such that corresponding crystalline orientations <001> having an 45 degree rotation; forming a patterned mask on the second semiconductor substrate to cover a first region and expose a second region; etching the second semiconductor substrate within the second region to expose the first semiconductor substrate; epitaxially growing a second semiconductor material on the first semiconductor substrate within the second region; and patterning the second semiconductor substrate and the second semiconductor material to forma first fin active region in the first region and a second fin active region in the second region. The first fin active region is oriented in a first direction and has a crystalline orientation <100> along the first direction. The second fin active region is oriented in the first direction and has a crystalline orientation <110> along the first direction.

The present disclosure provides a semiconductor structure in accordance with some embodiments. The semiconductor structure includes a semiconductor substrate having a first region and a second region; a first fin active region of a first semiconductor material disposed within the first region, oriented in a first direction, and being isolated from the semiconductor substrate by a dielectric feature, wherein the first fin active region has a <100> crystalline direction along the first direction; a second fin active region of a second semiconductor material disposed within the second region and oriented in the first direction, wherein the second fin active region has a <110> crystalline direction along the first direction; an n-type fin field-effect transistor (NFinFET) formed on the first fin active region; and a p-type fin field-effect transistor (PFinFET) formed on the second fin active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a semiconductor substrate having a first region and a second region;
a first fin of a first semiconductor material disposed within the first region, oriented in a first direction, wherein the first fin has a <100> crystalline direction along the first direction;
a second fin of a second semiconductor material disposed within the second region and oriented in the first direction, wherein the second fin has a <110> crystalline direction along the first direction;
a dielectric feature configured to isolate the first fin from the semiconductor substrate, wherein the dielectric feature is a silicon oxide feature; and
a silicon layer underlying the second fin, wherein the silicon layer includes a top surface being coplanar with a top surface of the dielectric feature.

2. The semiconductor structure of claim 1, further comprising:

an n-type field-effect transistor (nFET) formed on the first fin within the first region; and
a p-type field-effect transistor (pFET) formed on the second fin within the second region.

3. The semiconductor structure of claim 2, wherein the first semiconductor material is silicon, and the second semiconductor material is silicon germanium.

4. The semiconductor structure of claim 1, wherein the first fin continuously extends to the semiconductor substrate and the second fin includes multiple channels vertically stacked within the second regions.

5. The semiconductor structure of claim 4, further comprising a shallow trench isolation (STI) feature formed in the semiconductor substrate, wherein the STI feature has a sidewall directly contacting a sidewall of the dielectric feature.

6. The semiconductor structure of claim 5, wherein the STI feature has a top surface being coplanar with a top surface of the dielectric feature and the STI feature has a bottom surface being below a bottom surface of the dielectric feature.

7. The semiconductor structure of claim 1, wherein the silicon layer includes a bottom surface being coplanar with a bottom surface of the dielectric feature.

8. The semiconductor structure of claim 1, wherein each of the first fin and the second fin is in a crystalline structure with a top surface on a (100) crystal plane.

9. The semiconductor structure of claim 8, wherein the semiconductor substrate is a silicon substrate having a top surface on the (100) crystal plane.

10. The semiconductor structure of claim 9, wherein the semiconductor substrate has a crystalline orientation <110> along the first direction.

11. A semiconductor structure comprising:
a semiconductor substrate having a first region and a second region;
a first fin active region of a first semiconductor material disposed within the first region, oriented in a first direction, and being isolated from the semiconductor substrate by a dielectric feature, wherein the first fin active region has a <100> crystalline direction along the first direction;
a second fin active region of a second semiconductor material disposed within the second region and oriented in the first direction, wherein the second fin active region has a <110> crystalline direction along the first direction;
an n-type fin field-effect transistor (NFinFET) formed on the first fin active region; and
a p-type fin field-effect transistor (PFinFET) formed on the second fin active region; and
a silicon layer underlying the second fin active region, wherein the silicon layer includes a top surface being coplanar with a top surface of the dielectric feature.

12. The semiconductor structure of claim 11, wherein the first semiconductor material is silicon, and the second semiconductor material is silicon germanium.

13. The semiconductor structure of claim 12, wherein each of the first fin active region and the second fin active region is in a crystalline structure with a top surface on a (100) crystal plane;
the semiconductor substrate is a silicon substrate having a top surface on the (100) crystal plane; and
the semiconductor substrate has a crystalline orientation <110> along the first direction.

14. The semiconductor structure of claim 11, wherein the silicon layer includes a bottom surface being coplanar with a bottom surface of the dielectric feature.

15. The semiconductor structure of claim 14, further comprising a shallow trench isolation (STI) feature formed in the semiconductor substrate, wherein the STI feature has a sidewall directly contacting a sidewall of the dielectric feature.

16. The semiconductor structure of claim 15, wherein the STI feature has a top surface being coplanar with the top surface of the dielectric feature and the STI feature has a bottom surface being below a bottom surface of the dielectric feature.

17. A semiconductor structure, comprising:
a semiconductor substrate having a first region and a second region;
a first fin active region of a first semiconductor material disposed within the first region, oriented in a first direction, and being isolated from the semiconductor substrate by a dielectric feature, wherein the first fin active region has a <100> crystalline direction along the first direction;
a second fin active region of a second semiconductor material disposed on the semiconductor substrate within the second region and oriented in the first direction, wherein the second fin active region has a <110> crystalline direction along the first direction, the second semiconductor material being different from the first semiconductor material in composition;
a shallow trench isolation (STI) feature formed in the semiconductor substrate, wherein the STI feature has a sidewall directly contacting a sidewall of the dielectric feature, wherein the STI feature has a top surface being coplanar with the top surface of the dielectric feature and the STI feature has a bottom surface being below a bottom surface of the dielectric feature; and
a silicon layer underlying the second fin active region, wherein the silicon layer includes a top surface being coplanar with a top surface of the dielectric feature, wherein
each of the first fin active region and the second fin active region is in a crystalline structure with a top surface on a (100) crystal plane;
the semiconductor substrate is a silicon substrate having a top surface on a (100) crystal plane; and
the semiconductor substrate has a crystalline orientation <110> along the first direction.

18. The semiconductor structure of claim 17, wherein the first semiconductor material is silicon, and the second semiconductor material is silicon germanium.

19. The semiconductor structure of claim 17, wherein the dielectric feature spans between opposite edges of the first fin active region.

20. The semiconductor structure of claim 19, wherein the silicon layer spans between opposite edges of the second fin active region.

* * * * *